United States Patent
Suhail et al.

(10) Patent No.: US 7,764,550 B2
(45) Date of Patent: Jul. 27, 2010

(54) METHOD OF PROGRAMMING A NON-VOLATILE MEMORY

(75) Inventors: Mohammed Suhail, Austin, TX (US); Frank K. Baker, Jr., Austin, TX (US); Gowrishankar L. Chindalore, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 64 days.

(21) Appl. No.: 12/277,404

(22) Filed: Nov. 25, 2008

(65) Prior Publication Data

US 2010/0128537 A1 May 27, 2010

(51) Int. Cl.
G11C 16/04 (2006.01)
(52) U.S. Cl. .............. 365/185.28; 365/185.24; 365/185.29
(58) Field of Classification Search .......... 365/185.28
See application file for complete search history.

(56) References Cited

U.S. PATENT DOCUMENTS

| | | | |
|---|---|---|---|
| 5,377,147 A * | 12/1994 | Merchant et al. ....... | 365/185.09 |
| 6,064,597 A * | 5/2000 | Takeshima et al. ..... | 365/185.24 |
| 6,909,638 B2 | 6/2005 | Choy et al. | |
| 7,196,933 B2 * | 3/2007 | Shibata ................. | 365/185.22 |
| 7,292,473 B2 | 11/2007 | Niset et al. | |
| 7,342,833 B2 | 3/2008 | Cavins et al. | |
| 7,400,537 B2 * | 7/2008 | Hemink et al. ......... | 365/185.29 |
| 7,518,932 B2 * | 4/2009 | Barkley et al. ......... | 365/185.29 |
| 2006/0028875 A1 * | 2/2006 | Avraham et al. ....... | 365/185.24 |
| 2008/0117688 A1 * | 5/2008 | Park et al. ............. | 365/185.22 |
| 2008/0123420 A1 * | 5/2008 | Brandman et al. ..... | 365/185.09 |
| 2009/0122615 A1 * | 5/2009 | Jang et al. ............. | 365/185.18 |
| 2009/0164710 A1 * | 6/2009 | Choi et al. ............. | 711/103 |

FOREIGN PATENT DOCUMENTS

WO 2007030399 A2 3/2007

* cited by examiner

*Primary Examiner*—Son L Mai
(74) *Attorney, Agent, or Firm*—James L. Clingan, Jr.; David G. Dolezal

(57) ABSTRACT

A memory system including non-volatile memory cells. The memory system includes program circuitry that programs cells to a first threshold voltage or a second threshold voltage based on the number of times that cells of the memory system have been erased. In one embodiment, the threshold voltage is reduced when any set of cells of the memory system have been erased a specific number of times.

20 Claims, 4 Drawing Sheets

| | 34 | 64 | | 60 | 62 |
|---|---|---|---|---|---|
| 116 | 66 | 68 | 70 | 1 | 111110000 |
| 115 | | | | 1 | 111111110 |
| 114 | | | | 1 | 110000000 |
| 112 | | | | 1 | 000000000 |

↓

| | 34 | 64 | | 60 | 62 |
|---|---|---|---|---|---|
| 116 | 66 | 68 | 70 | 0 | 111110000 |
| 115 | | | | 0 | 111111110 |
| 114 | | | | 0 | 110000000 |
| 112 | | | | 0 | 000000000 |

METHOD OF PROGRAMMING A NON-VOLATILE MEMORY

BACKGROUND

1. Field

This disclosure relates generally to non-volatile memories, and more specifically, to programming non-volatile memories.

2. Related Art

Non-volatile memories (NVMs) that are programmable and erasable function properly for a limited duration which is measured by the number of program and erase cycles that can be performed before the memory stops functioning properly. Electron fluence during programming affects the endurance. Less electron fluence per program cycle will tend to result in more endurance. On the other hand electron fluence per erase cycle can only be reduced so far in order to maintain reliable sensing. Also important is data retention which is measured by the time a logic state can be maintained with stored charge.

Thus, it is desirable to provide an NVM that has desirable endurance and data retention under as many conditions as possible.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

A memory has non-volatile memory cells that have the characteristic of losing some charge when heated even by the amount of heated used in solder processes. It is desirable to load certain information into the memory prior to it being mounted on a printed circuit board by a solder process. During the solder process, some charge is lost in the NVM cells that were programmed. To prevent this charge loss from causing a loss of data, the NVM cells are programmed with more energy to provide more separation from the erased state. This is achieved at least in part by providing programming margin based on a higher reference voltage from that used in normal operation. Thus, the charge loss due to the solder process results in a reduction in the separation between the programmed state and the erased state but, because of beginning with a greater separation, the resulting separation is sufficient for reliable reading. After a predetermined number of program/erase cycles, the reference voltage is returned to the level for normal operation. Thus the extra energy used for the first few program/erase cycles has minimal effect on endurance and data retention.

Figure 1:
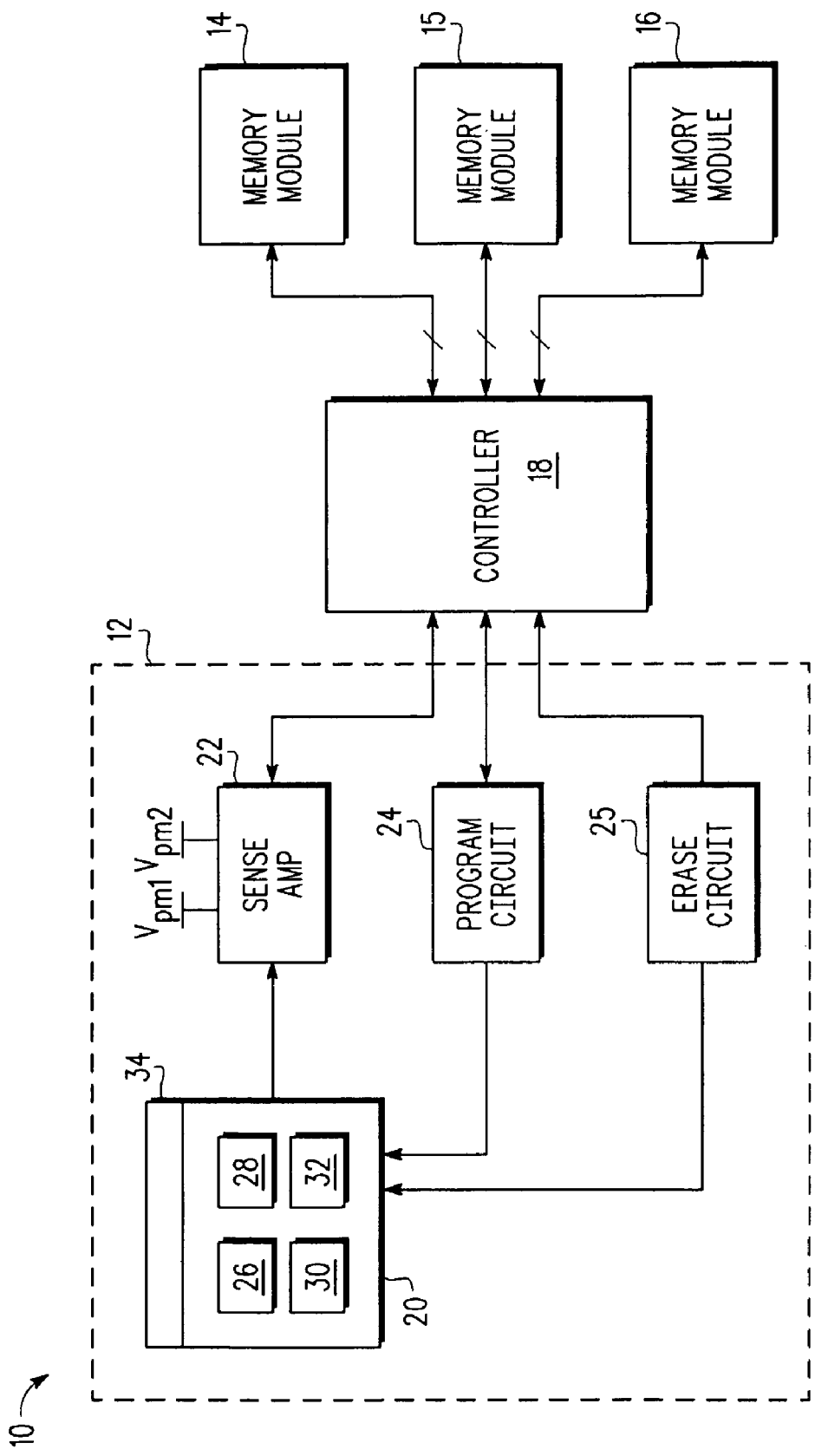
FIG. 1 is a block diagram of a memory according to a first embodiment.

Shown in FIG. 1 is a memory 10 comprising a memory module 12, a memory module 14, a memory module 15, and a memory module 16, and a controller 18. Memory module 12 comprises a memory array 20, a sense amplifier 22, a program circuit 24, and an erase circuit 25. Memory array 20 comprises a memory block 26, a memory block 28, a memory block 30, a memory block 32, and an information storage 34. Memory modules 14, 15, and 16 have the same structure and operation as memory module 12. Information storage can, on the other hand, be in a single memory array or even be in controller 18. It may be preferable for each memory to have its own information storage for array symmetry but as shown is also effective. Information storage 34 includes information about each of memory modules 12 and 14-15. Exemplary information includes unique die information, wafer lot processing information, test information, and operational information. In addition, information storage 34 is used for storing counts of program/erase operations. Sense amplifier 22, program circuit 24, and erase circuit 25 are coupled to array 20. Although not separately shown, array 20 includes row and column decoders and receives an address. Controller 18 is coupled to memory modules 12 and 14-16. As shown with regard to memory module 12, controller 18 is coupled to sense amplifier 22, program circuit 24, and erase circuit 25. Memory 10 may be on an integrated circuit with a processor that would be coupled to controller 18.

Figure 2:
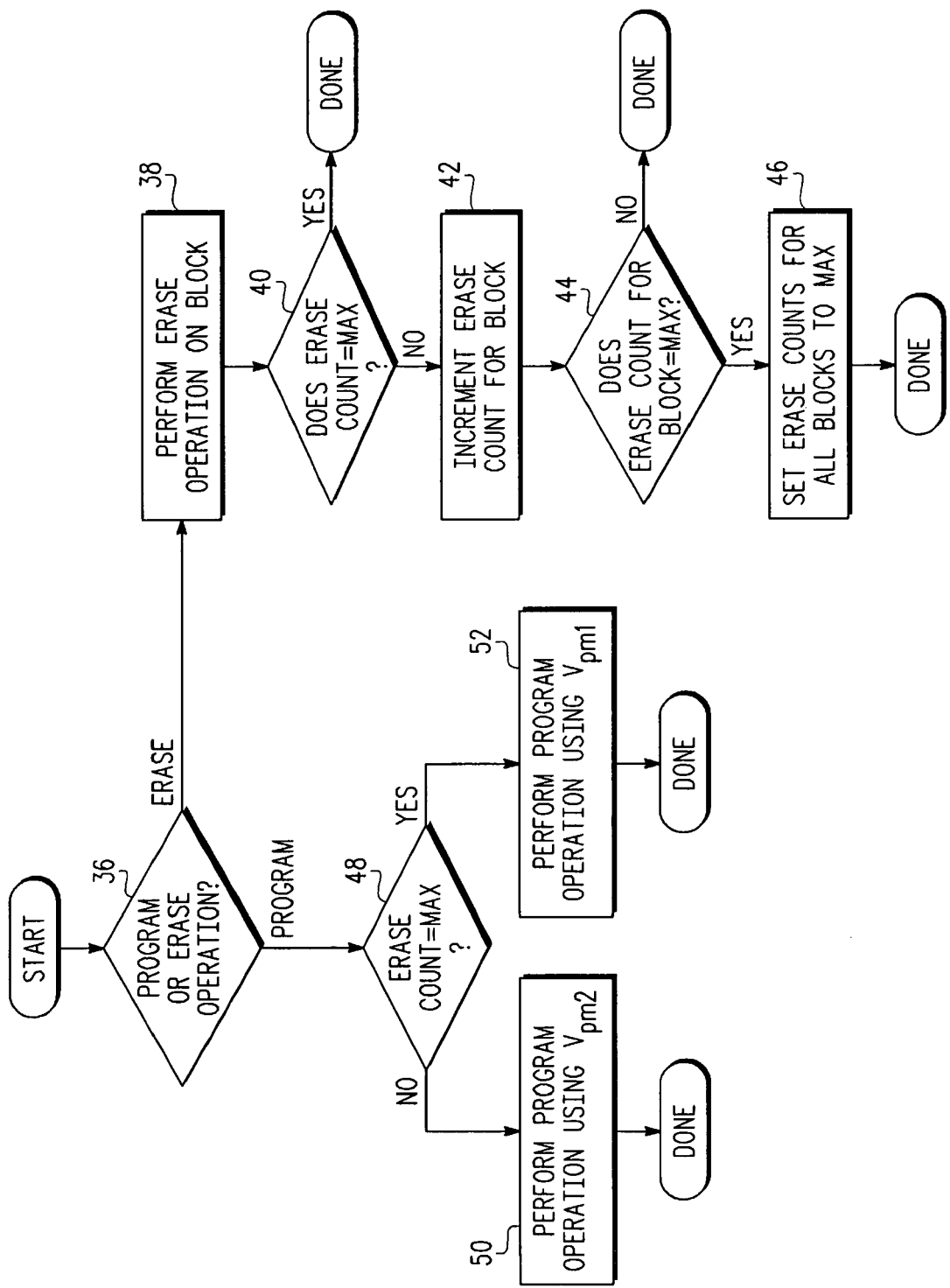
FIG. 2 is a flow chart helpful in understanding the operation of the memory of FIG. 1.

Shown in FIG. 2 is a flow chart describing a program operation and an erase operation for memory 10. Memory cells being in the erased state and are selectively programmed to the programmed state. Whether the programmed state is considered a logic high or a logic low is arbitrary. In current usage, the relatively higher threshold voltage is the programmed state and is a considered a logic low, which is the convention that is used herein. The principles, however, are applicable if programming and erasing are reversed or if the logic states are reversed.

Figures 3, 4:
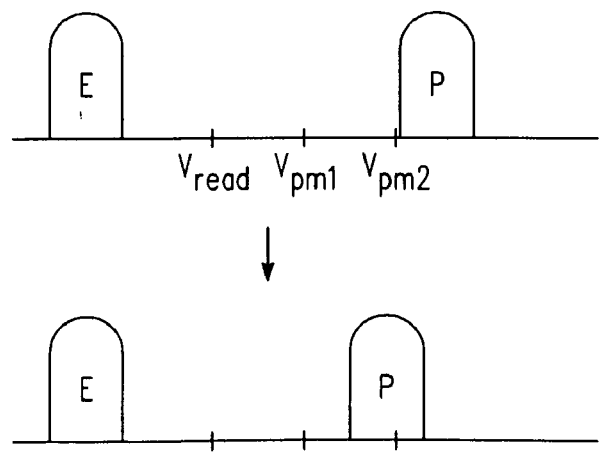
FIG. 3 is a block diagram of a portion of the memory of FIG. 1.
FIG. 4 is a graph showing a result of the operation of the memory of FIG. 1.

Shown in FIG. 3 is information storage 34 before and after a tenth program/erase cycle performed by memory module 12. Information storage 34 comprises rows 112, 114, 115, and 116 storing information of the type described previously. Shown in row 116, for example, are locations 66, 68, and 70 that store information. Rows 115, 114, and 112 have similar locations. Additionally, rows 112 and 114-116 have count locations shown as a location 62 and a location 60. Locations 62 and 60 of rows 112 and 114-116 store counts of program erase cycles performed on memory modules 12 and 14-16, respectively. Location 60 is also a max count indicator.

Shown in FIG. 4 is a program and erase distribution of programming states memory cells of memory 10 before and after a solder mounting operation performed on memory 10 as discovered by the inventors. The distribution of memory cells in the erased state is to the left of Vread which is the threshold voltage that divides a cell that is considered erased from a cell that is considered programmed. The upper portion of FIG. 4 shows programmed cells to the right of a threshold voltage corresponding to reference voltage Vpm2. The distribution of threshold voltages shown at the right voltage Vpm2 occurs as a result of using voltage Vpm2 as the reference when programming which is the reference used before memory 10 is soldered to a printed circuit board. The lower portion of the graph of FIG. 4 shows that the programmed cells shift to the left, closer to Vread because of charge loss during the solder mounting operation. The programmed cells are still to the right of a threshold voltage shown at voltage Vpm1 which is the threshold voltage that occurs when programming using voltage Vpm1 as the reference. Voltage Vpm1 is the voltage used soon after the solder operation. The inventors have found minimal movement for the erased state due to the heat associated with the solder operation.

A program step for a memory cell begins as shown in step 36 with a decision at step 48 as to whether an erase count has already reached a maximum count. The maximum count is a predetermined number based on an estimate of how many program erase cycles will be performed before memory 10 is solder mounted. Eight is probably sufficient. For extra margin this number may be increased. Ten is shown in this example, an effective range is 8-12, but this could easily change with further developments. Thus in this example if the program erase count has reached ten, the program operation is performed using voltage Vpm1 as the reference in sense amplifier 22 to verify the program. The actual programming occurs by controller 18 directing program circuit 24 to provide a program pulse to array 20. Array 20 selects which memory block among memory blocks 26, 28, 30, and 32 and which memory cell within that memory block that will be programmed. After each pulse the selected memory cell is read by sense amplifier 22 using voltage Vpm1 as the reference. If it is considered programmed, which in this example is a logic low, then no more program pulses are applied as determined by controller 18. If it is not, then programming continues under the direction of controller 18, alternating between applying programming pulses and reading the state of the memory cell until the memory cell either passes or is considered a defective cell.

If in step 48, controller 18 determines that the predetermined count has not been reached, then programming begins at step 50 with controller 18 directing program circuit 24 to apply a programming pulse to array 20. As in the case for normal programming, array 20 directs the programming pulse to the selected memory cell. In this case where the selected memory cell is programmed before the predetermined number of program/erase cycles has occurred, the program pulse may be varied to be longer or greater in magnitude or both compared to the normal program pulse. After receiving the program pulse, the memory cell is sensed by sense amplifier 22 using voltage Vpm2 as the reference voltage. Controller 18 directs sense amplifier 22 to use voltage Vpm2 as the reference. In order for the memory cell to be considered programmed with voltage Vpm2 as the reference, the memory cell has to have a threshold voltage that is further from Vread than the threshold voltage associated with using voltage Vpm1 as the reference. If the read shows that the memory cell passes with the reference at voltage Vpm2, then programming is complete. If the memory cell does not pass, alternate programming pulses and reads occur until either the memory cell passes or is considered a defective cell.

If an erase operation is to begin as indicated in step 36, an erase operation is performed on the block or memory module. If erases are performed on a block basis, additional locations for counting will be added to information storage 34 for counting erase operations for each block. There would be four count locations per memory module so for this case of four memory modules, there would be 16 count locations in information storage 34. Assume in this case that the erase is to be performed in block 26 and that locations 60 and 62 in row 112 are tracking block 26 of memory module 12. In location 62, nine bits are assigned, and each bit is used to record one program/erase cycle on block 26. Initial information storage 34 is erased, so all nine bits are a logic low. As each program/erase cycle is performed on block 26, one of the nine bits is programmed to a logic high. In this example, location 62 has nine, seven, one and four bits programmed in rows 112, 114, 115 and 116, respectively, indicating the number of program/erase cycles already performed on memory modules 12, 14, 15 and 16. Controller 18 directs erase circuit 25 to provide the erase voltage, which may include more than one signal, to memory 20 which in turn directs the erase voltage to the selected memory cell in block 26. After the erase has been performed, in step 40 controller 18 determines if the number of erase cycles has reached the predetermined count. The predetermined count can also be considered the maximum number of counts before switching from voltage reference Vpm2 to reference voltage Vpm1 for programming operations. The count information is read by sense amplifier 22 from information storage 34 and more particularly row 112 and more particularly bit location 60 of row 112. If the logic state is a logic high, then the maximum count has not been reached. If it has been reached it is a logic low and the operation is complete and would mean that normal operation using voltage Vpm1 as the reference has already commenced. In this example, it is a logic high as shown in the upper portion of FIG. 3 which means that sense amplifier has still been using voltage Vpm2 as the reference. Location 62 shows all zeros which means that nine erase cycles have already been performed on module 12. Because the count had not previously reached ten, the erase count is incremented in row 112 to ten which is achieved by programming bit location 60 in row 112 to zero. Controller 18 reads the contents of information storage 34 through sense amplifier 22 and writes to information storage 34 through program circuit 24. The incremented erase count has the affect of setting bit 60 of row 112 to indicate that the maximum number of erase cycles has been reached. Thus as shown in step 44, it is determined by controller 18 that the maximum count has been reached so that bit location 60 is programmed to a zero for all of the blocks in all of memory modules 12 and 14-16 as shown for step 46 and in the lower portion of FIG. 3. In this example then, controller 18 will read from bit location 60, regardless of the block, that the maximum count of erase cycles has been reached and will then direct sense amplifier 22 to use voltage Vpm1 as the reference for programming.

There is a strong correlation between erase cycles and program cycles. The erase cycles tend to apply to more of the memory cells of the memory when performed and would thus be easier to count than program cycles which will often involve much fewer cells for a given operation. Since each bit is only programmed once before an erase of the entire array (or portion of the array), counting the number of erase operations is an effective way track the total program/erase usage of the memory. Although it is not necessary for the programming potentials applied to a memory to be different before and the after the predetermined number of erase cycles has been reached, such differences may be beneficial. These can include differences in one or more of the source voltage, drain voltage, control gate voltage, select gate voltage, substrate bias voltage, and time duration.

Figure 5:
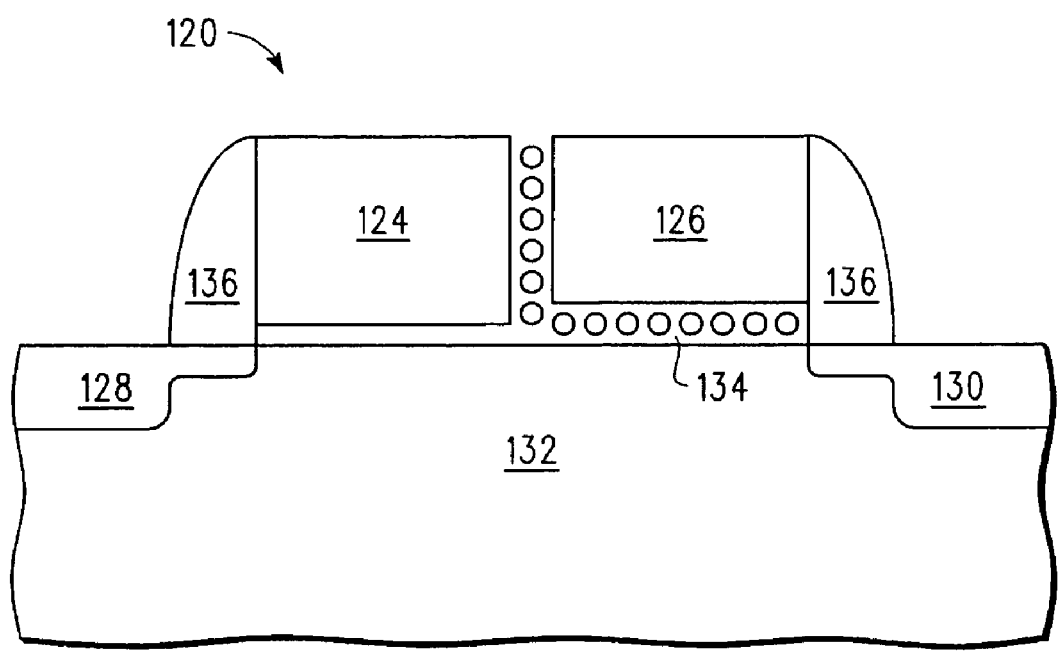
FIG. 5 is a cross section of a non-volatile memory cell used in the memory of FIG. 1.

Shown in FIG. 5 is an exemplary NVM cell 120 for use in memory modules 12 and 14-16 of memory 10 comprising a select gate 126, a control gate 124, a sidewall spacer 136 around select gate 126 and control gate 124 of NVM cell 120, a substrate 132, a source/drain 128, a drain/source 130, and a storage layer 134 between select gate 126 and substrate 132. Storage layer 134 is shown as being nanocrystals. Such a memory cell with nanocrystal storage has demonstrated the property of losing some charge when heated to the levels typically required by the solder operation. An alternative is that nitride can be substituted for the nanocrystal layer and demonstrate the same characteristic of losing some charge when heated in a solder operation. The problem has been shown to be less in the case of memory cells with a single floating gate, but this may change as processes change so potentially the described operation could be applicable to the case of the storage layer being a single floating gate.

By now it should be appreciated that there has been provided a memory system that includes a plurality of non-volatile memory cells, each memory cell of the plurality is programmable and erasable. The memory system further includes program circuitry for programming memory cells of the plurality of non-volatile memory cells, the program circuitry programs memory cells of the plurality to above a first program threshold voltage in response to a first mode and to above a second program threshold voltage in response to a second mode, wherein the first program threshold voltage is different than the second program threshold voltage. The memory system further includes erase circuitry for erasing cells of the plurality of non-volatile memory cells. The memory system further includes a count circuit, the count circuit including an erase count value. The memory system further includes count increment circuitry for incrementing the erase count value in response to an erase operation of the plurality of memory cells when in the first mode, wherein the first mode transitions to the second mode in response to the erase count value reaching a specific value. The memory system may further comprise a second plurality of non-volatile memory cells in which each memory cell of the second plurality is programmable and erasable and a second count circuit including a second erase count value and may be further characterized by the program circuitry programming memory cells of the second plurality of non-volatile memory cells, the program circuitry programming memory cells of the second plurality to above the first program threshold voltage in response to the first mode and to above the second program threshold voltage in response to the second mode and the second erase count value being incremented in response to an erase operation of the second plurality of memory cells during the first mode, wherein the first mode transitions to the second mode in response to the second erase count value reaching the specific value. The memory system may be further characterized by the first plurality of memory cells and the second plurality of memory cells being located in an array of memory cells. The memory system may be further characterized by the count increment circuitry incrementing the first erase count value to the specific value in response to the second erase count value reaching the specific value. The memory system may further comprise a first array of non-volatile memory cells, the plurality of non-volatile memory cells is implemented in the first array, the program circuitry including circuitry for programming memory cells of the first array and a second array of non-volatile memory cells, the second plurality of non-volatile memory cells is implemented in the second array, the program circuitry including circuitry for programming memory cells of the second array. The memory system may further comprise a third plurality of non-volatile memory cells, each memory cell of the third plurality is programmable and erasable and a third count circuit including a third erase count value, wherein the program circuitry programs memory cells of the third plurality of non-volatile memory cells, the program circuitry programs memory cells of the third plurality to above the first program threshold voltage in response to the first mode and to above the second program threshold voltage in response to the second mode, and wherein the third erase count value is incremented in response to an erase operation of the third plurality of memory cells during the first mode, wherein the first mode transitions to the second mode in response to the third erase count value reaching the specific value. The memory system may be further characterized by the specific value being in a range of 8-12. The memory system may be further characterized by the program circuitry programming a cell of the plurality of non-volatile memory cells by storing charge in a charge storage structure of the memory cell, the programming circuit programming a memory cell to above the first program threshold voltage in response to the first mode by storing charge in the charge storage structure such that a voltage threshold of the memory cell is above the first threshold voltage, and the programming circuit programming a memory cell to above the second program threshold voltage in response to the second mode by storing charge in the charge storage structure such that the voltage threshold of the memory cell is above the second threshold voltage. The memory system may be further characterized by the plurality of non-volatile memory cells being implemented in a first location of a memory array of non-volatile memory cells and the count circuit being implemented in a second location of the memory array. The memory system may be further characterized by each memory of the plurality of non-volatile memory cells including a charge storage structure including nitride.

Also described is a memory system including a plurality of sets of non-volatile memory cells, each memory cell of the plurality of sets is programmable and erasable. The memory system further includes program circuitry for programming memory cells of the plurality of sets, the program circuitry programs memory cells of the plurality of sets to above a first program threshold voltage in response to the memory system being in a first mode and to above a second program threshold voltage in response to the memory system being in a second mode. The memory system further includes erase circuitry for erasing memory cells of the plurality of sets. The memory system further includes a plurality of count circuits each for storing an erase count for each set of the plurality of sets. The memory system further includes count increment circuitry for incrementing erase count values of the plurality of count circuits, the count increment circuitry incrementing a count circuit associated with a set of the plurality of sets in response to an erase operation of the set during the first mode, wherein the first mode transitions to the second mode based upon any erase count value of the plurality of count circuits reaching a specific value. The memory system may be further characterized by the specific value being in a range of 8-12. The memory system may be further characterized by the first program threshold voltage being greater than the second program threshold voltage. The memory system may be further characterized by the program circuitry programming memory cells of the plurality of sets for a first time duration, at a first voltage of a gate type, and at a first source voltage in response to the memory system being in the first mode and the program circuitry programming memory cells of the plurality of sets for a second time duration, at a second voltage of the gate type, and at a second source voltage in response to the memory system being in the second mode wherein the program circuitry comprises one characteristic of a group consisting of: the first time duration being longer than the second time duration, the first voltage of the gate type being higher than the second voltage of the gate type, the first source voltage being higher than the second source voltage, a source voltage being different between the first mode and the second mode, and a substrate bias voltage being different between the first mode and the second mode. The memory system may further comprise a first array of non-volatile memory cells, a first set of the plurality is in the first array and a second array of non-volatile memory cells, a second set of the plurality is in the second array. The memory system may further comprise at least one non-volatile memory array, each set of the plurality of sets is located in an array of the at least one memory array, wherein each count circuit is located in an array of the least one memory array that includes its respective set of the plurality of sets.

Described also is a method of operating a memory system, wherein the memory system includes a plurality of non-volatile memory cells. The method includes determining whether memory cells of the plurality of non-volatile memory cells have been erased at least a specific number of times. The method further includes programming a memory cell of the plurality of non-volatile memory cells, the programming includes programming the memory cell to above a first program threshold voltage in response to the determining that memory cells have been erased at least a specific number of times, the programming includes programming the memory cell to above a second program threshold voltage in response to the determining that memory cells have not been erased at least the specific number of times, wherein the second threshold voltage is different from the first threshold voltage. The method may be further characterized by the second threshold voltage is higher than the first threshold voltage. The method may be further characterized by the plurality of non-volatile memory cells including a plurality of sets of non-volatile memory cells, the determining whether memory cells of the plurality of non-volatile memory cells having been erased at least a specific number of times including determining whether any set of the plurality of sets has been erased at least the specific number of times, the programming the memory cell to above the first program threshold voltage in response to the determining that memory cells having been erased at least the specific number of times including programming the memory cell to above a first program threshold voltage in response to the determining that any set of the plurality of sets has been erased at least the specific number of times, and the programming the memory cell to above the second program threshold voltage in response to the determining that memory cells having not been erased at least the specific number of times including the determining that no set of the plurality of sets has been erase the specific number of times. The method may be further characterized by the specific number being in a range of 8-12.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. For example, a controller is shown as directing the programming and erase operations which may be implemented as a state machine or a processor, which may have many other functions, can be used as the controller. Further the addressing of array 20 may be through a processor or other circuitry not shown or from controller 8. The transition from a logic high to a logic low is described as programming but a transition from a logic high to a logic low can also be considered programming even if the programming is in bulk. What is called programming could also be called erasing and then what is called erasing would be called programming. Also the programming is shown as having two references but more be utilized as well. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A memory system, comprising:
    a plurality of non-volatile memory cells, each memory cell of the plurality is programmable and erasable;
    program circuitry for programming memory cells of the plurality of non-volatile memory cells, the program circuitry programs memory cells of the plurality to above a first program threshold voltage in response to a first mode and to above a second program threshold voltage in response to a second mode, wherein the first program threshold voltage is different than the second program threshold voltage;
    erase circuitry for erasing cells of the plurality of non-volatile memory cells;
    a count circuit, the count circuit including an erase count value; and
    count increment circuitry for incrementing the erase count value in response to an erase operation of the plurality of memory cells when in the first mode, wherein the first mode transitions to the second mode in response to the erase count value reaching a specific value.

2. The memory system of claim 1, further comprising:
    a second plurality of non-volatile memory cells, each memory cell of the second plurality is programmable and erasable;
    wherein the program circuitry programs memory cells of the second plurality of non-volatile memory cells, the program circuitry programs memory cells of the second plurality to above the first program threshold voltage in response to the first mode and to above the second program threshold voltage in response to the second mode; and
    a second count circuit including a second erase count value;
    wherein the second erase count value is incremented in response to an erase operation of the second plurality of memory cells during the first mode, wherein the first mode transitions to the second mode in response to the second erase count value reaching the specific value.

3. The memory system of claim 2, wherein the first plurality of memory cells and the second plurality of memory cells are located in an array of memory cells.

4. The memory system of claim 2, wherein the count increment circuitry increments the first erase count value to the specific value in response to the second erase count value reaching the specific value.

5. The memory system of claim 2, further comprising:
a first array of non-volatile memory cells, the plurality of non-volatile memory cells is implemented in the first array, the program circuitry including circuitry for programming memory cells of the first array; and
a second array of non-volatile memory cells, the second plurality of non-volatile memory cells is implemented in the second array, the program circuitry including circuitry for programming memory cells of the second array.

6. The memory system of claim 2, further comprising:
a third plurality of non-volatile memory cells, each memory cell of the third plurality is programmable and erasable;
wherein the program circuitry programs memory cells of the third plurality of non-volatile memory cells, the program circuitry programs memory cells of the third plurality to above the first program threshold voltage in response to the first mode and to above the second program threshold voltage in response to the second mode;
a third count circuit including a third erase count value; and
wherein the third erase count value is incremented in response to an erase operation of the third plurality of memory cells during the first mode, wherein the first mode transitions to the second mode in response to the third erase count value reaching the specific value.

7. The memory system of claim 1, wherein the specific value is in a range of 8-12.

8. The memory system of claim 1, wherein:
the program circuitry programs a cell of the plurality of non-volatile memory cells by storing charge in a charge storage structure of the memory cell,
the programming circuit programs a memory cell to above the first program threshold voltage in response to the first mode by storing charge in the charge storage structure such that a voltage threshold of the memory cell is above the first threshold voltage;
the programming circuit programs a memory cell to above the second program threshold voltage in response to the second mode by storing charge in the charge storage structure such that the voltage threshold of the memory cell is above the second threshold voltage.

9. The memory system of claim 1, wherein the plurality of non-volatile memory cells is implemented in a first location of a memory array of non-volatile memory cells, wherein the count circuit is implemented in a second location of the memory array.

10. The memory system of claim 1, wherein each memory of the plurality of non-volatile memory cells includes a charge storage structure including nitride.

11. A memory system, comprising:
a plurality of sets of non-volatile memory cells, each memory cell of the plurality of sets is programmable and erasable;
program circuitry for programming memory cells of the plurality of sets, the program circuitry programs memory cells of the plurality of sets to above a first program threshold voltage in response to the memory system being in a first mode and to above a second program threshold voltage in response to the memory system being in a second mode;
erase circuitry for erasing memory cells of the plurality of sets;
a plurality of count circuits each for storing an erase count for each set of the plurality of sets; and
count increment circuitry for incrementing erase count values of the plurality of count circuits, the count increment circuitry incrementing a count circuit associated with a set of the plurality of sets in response to an erase operation of the set during the first mode, wherein the first mode transitions to the second mode based upon any erase count value of the plurality of count circuits reaching a specific value.

12. The memory system of claim 11, wherein the specific value is in a range of 8-12.

13. The memory system of claim 11, wherein the first program threshold voltage is greater than the second program threshold voltage.

14. The memory system of claim 13, wherein:
the program circuitry programs memory cells of the plurality of sets for a first time duration, at a first voltage of a gate type, and at a first source voltage in response to the memory system being in the first mode; and
the program circuitry programs memory cells of the plurality of sets for a second time duration, at a second voltage of the gate type, and at a second source voltage in response to the memory system being in the second mode;
wherein the program circuitry comprises one characteristic of a group consisting of:
the first time duration is longer than the second time duration;
the first voltage of the gate type is higher than the second voltage of the gate type;
the first source voltage is higher than the second source voltage;
a source voltage is different between the first mode and the second mode; and
a substrate bias voltage is different between the first mode and the second mode.

15. The memory system of claim 11, further comprising:
a first array of non-volatile memory cells, a first set of the plurality is in the first array;
a second array of non-volatile memory cells, a second set of the plurality is in the second array.

16. The memory system of claim 11, further comprising:
at least one non-volatile memory array, each set of the plurality of sets is located in an array of the at least one memory array;
each count circuit is located in an array of the least one memory array that includes its respective set of the plurality of sets.

17. A method of operating a memory system, wherein the memory system includes a plurality of non-volatile memory cells, the method comprising:
determining whether memory cells of the plurality of non-volatile memory cells have been erased at least a specific number of times; and
programming a memory cell of the plurality of non-volatile memory cells, the programming includes programming the memory cell to above a first program threshold voltage in response to the determining that memory cells have been erased at least a specific number of times, the programming includes programming the memory cell to above a second program threshold voltage in response to the determining that memory cells have not been erased at least the specific number of times, wherein the second threshold voltage is different from the first threshold voltage.

18. The method of claim 17, wherein the second threshold voltage is higher than the first threshold voltage.

19. The method of claim 17, wherein:
the plurality of non-volatile memory cells includes a plurality of sets of non-volatile memory cells;

the determining whether memory cells of the plurality of non-volatile memory cells have been erased at least a specific number of times includes determining whether any set of the plurality of sets has been erased at least the specific number of times;

the programming the memory cell to above the first program threshold voltage in response to the determining that memory cells have been erased at least the specific number of times includes programming the memory cell to above a first program threshold voltage in response to the determining that any set of the plurality of sets has been erased at least the specific number of times; and the programming the memory cell to above the second program threshold voltage in response to the determining that memory cells have not been erased at least the specific number of times includes the determining that no set of the plurality of sets has been erase the specific number of times.

20. The method of claim 17, wherein the specific number is in a range of 8-12.

* * * * *